United States Patent [19]
Jensen

[11] Patent Number: 5,703,376
[45] Date of Patent: Dec. 30, 1997

[54] MULTI-LEVEL RESOLUTION LITHOGRAPHY

[75] Inventor: John V. Jensen, Fremont, Calif.

[73] Assignee: LSI Logic Corporation, Milpitas, Calif.

[21] Appl. No.: 655,249

[22] Filed: Jun. 5, 1996

[51] Int. Cl.⁶ .................................... H01J 37/302
[52] U.S. Cl. .................... 250/492.22; 250/398
[58] Field of Search ............ 250/492.22, 492.2, 250/398, 492.23, 492.21, 492.3, 396 R, 396 ML

[56] References Cited

U.S. PATENT DOCUMENTS

| | | | |
|---|---|---|---|
| 4,075,488 | 2/1978 | Okayama et al. | 250/396 R |
| 4,243,866 | 1/1981 | Pfeiffer et al. | 219/121 EK |
| 4,310,743 | 1/1982 | Seliger | 219/121 EB |
| 4,392,058 | 7/1983 | Smith | 250/492.2 |
| 4,451,738 | 5/1984 | Smith | 250/492.2 |
| 4,498,010 | 2/1985 | Biechler et al. | 250/492.22 |
| 4,868,395 | 9/1989 | Kasahara et al. | 250/398 |
| 5,103,101 | 4/1992 | Berglund et al. | 250/492.22 |
| 5,340,700 | 8/1994 | Chen et al. | 430/312 |
| 5,424,154 | 6/1995 | Borodovsky | 430/5 |
| 5,454,048 | 9/1995 | Davis | 382/281 |

*Primary Examiner*—Kiet T. Nguyen
*Attorney, Agent, or Firm*—John Schipper; Franklyn C. Weiss

[57] ABSTRACT

A system for lithographic rastering of an image, defined by an array of pixels, onto an image-accepting substrate that allows irradiation of the total pixel pattern in reduced time. The total image is first divided into a collection of one or more geometrically isolated pixel arrays, with all pixels in an array being connected to each other. Each pixel array is decomposed into a fine region, consisting of all image pixels within P pixels of a boundary of that array, where P is a selected positive integer, such as 1, 2 or 3, and a bulk region consisting of all image pixels in that array that are not part of a fine region. A pixel array may include one or more bulk regions and one or more fine regions. A fine region for a pixel array is further decomposed into a first fine sub-region with pixel width at least equal to P1 pixels, where P1 is a selected integer satisfying $2 \leq P1 \leq P$, and a second fine sub-region with pixel width no greater than P1-1 pixels.

16 Claims, 5 Drawing Sheets

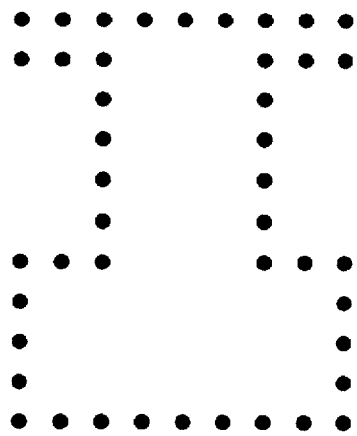
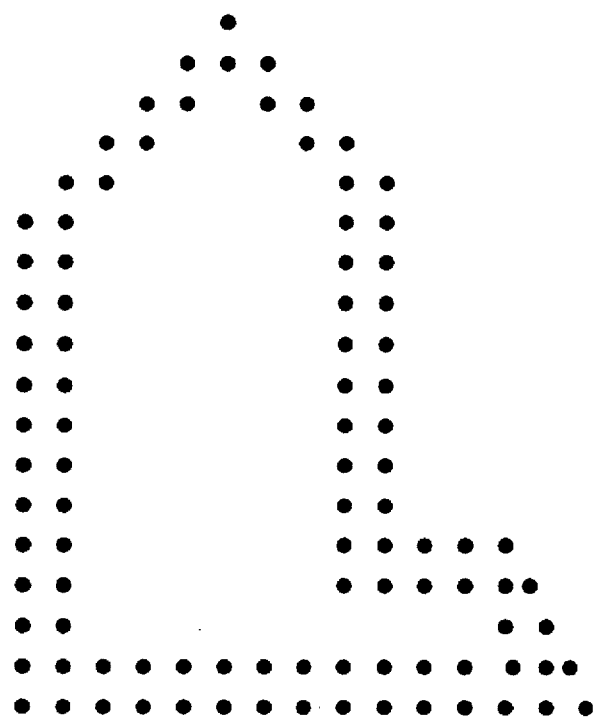
FIG. 2A   FIG. 2B
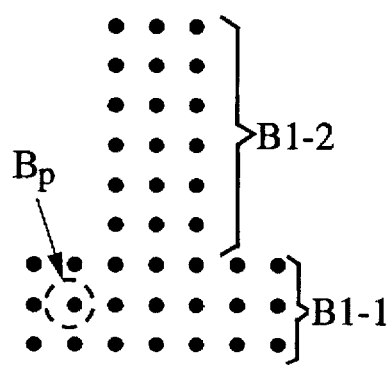
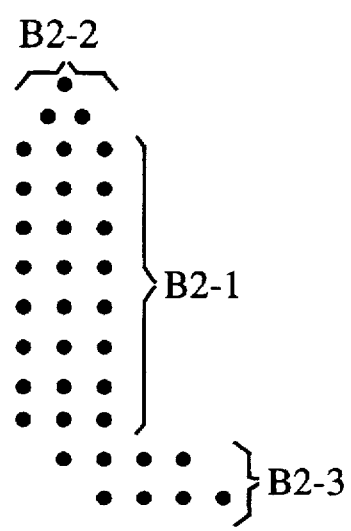
FIG. 2C   FIG. 2D

FIG. 5A
FIG. 5B
FIG. 5C
FIG. 5D
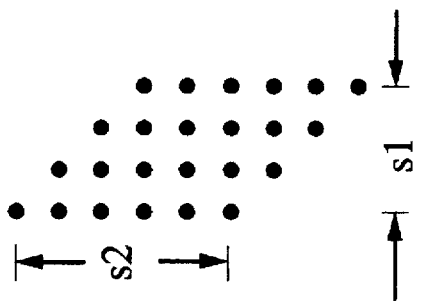
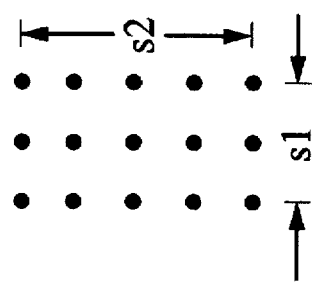
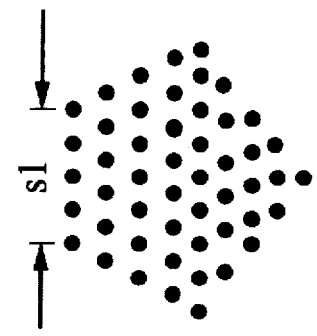
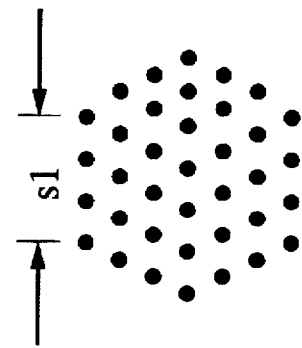
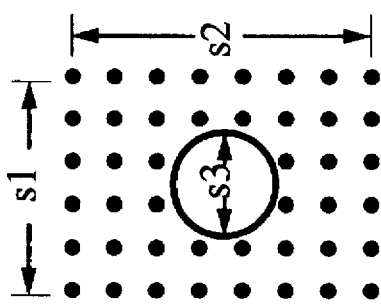
FIG. 5E
FIG. 5F
FIG. 5G

MULTI-LEVEL RESOLUTION LITHOGRAPHY

FIELD OF THE INVENTION

This invention relates to lithographic rastering techniques used for image forming activities, such as semiconductor processing.

BACKGROUND OF THE INVENTION

Lithographic rastering, for purposes of writing an image on a semiconductor substrate, is a slow process, even where the rastering is highly automated. Bulk regions for which an image is to be produced on the substrate are written on at the same pace (i.e., line-by-line or pixel-by-pixel) as are thin traces. The result is that lithographic rastering of a complete image, involving thin traces and bulk regions, onto a semiconductor substrate may require hundreds of seconds for its completion.

Several workers have proposed improvements in the conventional step-and-repeat exposure procedures for pixel imaging. A pattern forming system using quadrupole lenses with variable charged particle image sizes is disclosed in U.S. Pat. No. 4,075,488, issued to Okayama et at. Rectangular and line images are provided by this system.

U.S. Pat. Nos. 4,213,053 and 4,243,866, issued to Pfeiffer et al, disclose provision of electron beam shaping to set down images on a pixel array from a preselected set of characters, preferably rectangular, by parallel projection of these images. First and second shaped e-beams form a composite image.

Seliger, in U.S. Pat. No. 4,310,743, discloses a high resolution approach in which a desired pixel pattern is divided into segments, each with a segment area that optimizes the resolution of that segment, using an aligned ion beam mask to separately define each segment in the pattern to be imaged in a step and repeat procedure.

Use of a first electron beam for high resolution, low current, relatively slow, fine writing e-beam and of a second electron beam of higher current for relatively coarse e-beam writing is disclosed by Smith in U.S. Pat. No. 4,392,058. The first e-beam source may be a field emission source, and the second e-beam source may be a thermionic emission source, each controlled by a magnetic field deflection device. The first and second e-beams provide complementary portions of a desired pattern. In U.S. Pat. No. 4,451,738, Smith discloses provision of the first and second e-beams in parallel for simultaneous, one pass scanning.

In U.S. Pat. No. 4,498,010, issued to Biechler et al, an e-beam lithography process is disclosed for writing a repeated pattern, such as a plurality of stripes with constant width on photoresist material. An additional row or column of alternate pixels of one-half the normal width is written either before or after the stripes are written, to reduce perceived blurring of the resulting image, where desired. This approach allows a slight widening or lengthening of the e-beam pattern.

Use of a first, focused electron beam to produce a foreground image and of a second, defocused electron beam to form a background image on a target surface is disclosed in U.S. Pat. No. 4,868,395, issued to Kasahara et al.

Berglund et al disclose an approach to e-beam lithography that use multiple e-beam passes that are interleaved to produce a result that is nearly equivalent to a single pass normal e-beam raster scan in U.S. Pat. No. 5,103,101. This approach allows use of some beam averaging techniques that may improve lithography quality. Individual pixels with diameters between 0.5 μm and 2 μm are used in each e-beam pass.

A lithographic method for mask-aided, e-beam writing of a first edge at high resolution, followed by high resolution, mask-aided, e-beam writing of a second edge that is adjacent to and within a Raleigh resolution length of the first edge, is disclosed in U.S. Pat. No. 5,340,700, issued to Chen et al. This approach is asserted to produce perpendicularly oriented edges and closely spaced, approximately parallel edges with high resolution and little beam spillover.

U.S. Pat. Nos. 5,424,154 and 5,498,579, issued to Borodovsky, disclose use of a first e-beam or light exposure mask to produce a pattern with small characteristic widths, then use of a second exposure mask, to produce complementary patterns for isolated structures with reduced total pattern widths, reduced proximity effects, improved resolution and improved contrast between the exposed and unexposed regions.

Davis discloses use of Hadamard transform techniques for multiple lithographic imaging of portions of a desired pattern, in U.S. Pat. No. 5,454,048. This approach is asserted to be specially useful for imaging in wavelength regions where efficient focal plane arrays are unavailable. The final image is produced by convergent tiling of the image plane, in contrast to conventional raster scanning of a desired image.

What is needed is an approach that takes account of the differences between rastering of a bulk region image and rastering of a thin trace or boundary image and that treats each of these two types of images differently in order to reduce the time required for lithographic rastering of the total image. Preferably, this approach should be flexible and should allow for modification in the approach to optimize the rastering procedure for the nature of the image to be set down.

SUMMARY OF THE INVENTION

These needs are met by the invention, which first divides the image to be set down into isolated arrays of pixels, with all pixels in an isolated array being connected to each other. Each isolated array is decomposed into a first assembly of one or more fine regions, each fine region including only pixels in the array that are within P pixels of a boundary pixel of that array (P≧1), and a second assembly of zero, one or more bulk regions that include all image pixels in that array that are not in a fine region. The fine regions include pixels that define circuit traces and include array boundary points. The first assembly of image pixels is set down using a conventional pixel-by-pixel or line-by-line imaging process that preserves the fine detail at the edges, or in isolated regions, of the total image. The second assembly of image pixels is set down using a bulk rastering procedure that exposes each constituent bulk region with one or more relatively coarse images that together cover the bulk region, thus reducing the time required for bulk region imaging vis-a-vis the time that would be required for pixel-by-pixel or line-by-line imaging. Either the first assembly or the second assembly can be set down first, or portions of the first assembly and of the second assembly can be set down in an alternating procedure or in a simultaneous procedure. The character of the bulk region imager or of the particular image to be set down can be accounted for by choosing an optimal breadth. In an alternative approach, a two-dimensional bulk region imager can be used with minimum width n1 pixels in a first direction and minimum width n2 pixels in an independent direction (e.g., approximately perpendicular) on the substrate.

BRIEF DESCRIPTION OF THE DRAWINGS

FIGS. 2A and 2B illustrate an assembly of fine regions, formed from the image regions F1 and F2 in FIG. 1 according to one embodiment of the invention.

FIGS. 2C and 2D illustrate an assembly of bulk regions, formed from the image regions B1 and B2 in FIG. 1 according to one embodiment of the invention.

FIGS. 5A, 5B, 5C, 5D, 5E, 5F and 5G illustrate some suitable shapes for defining bulk regions used in the invention.

DESCRIPTION OF BEST MODES OF THE INVENTION

Figure 1:
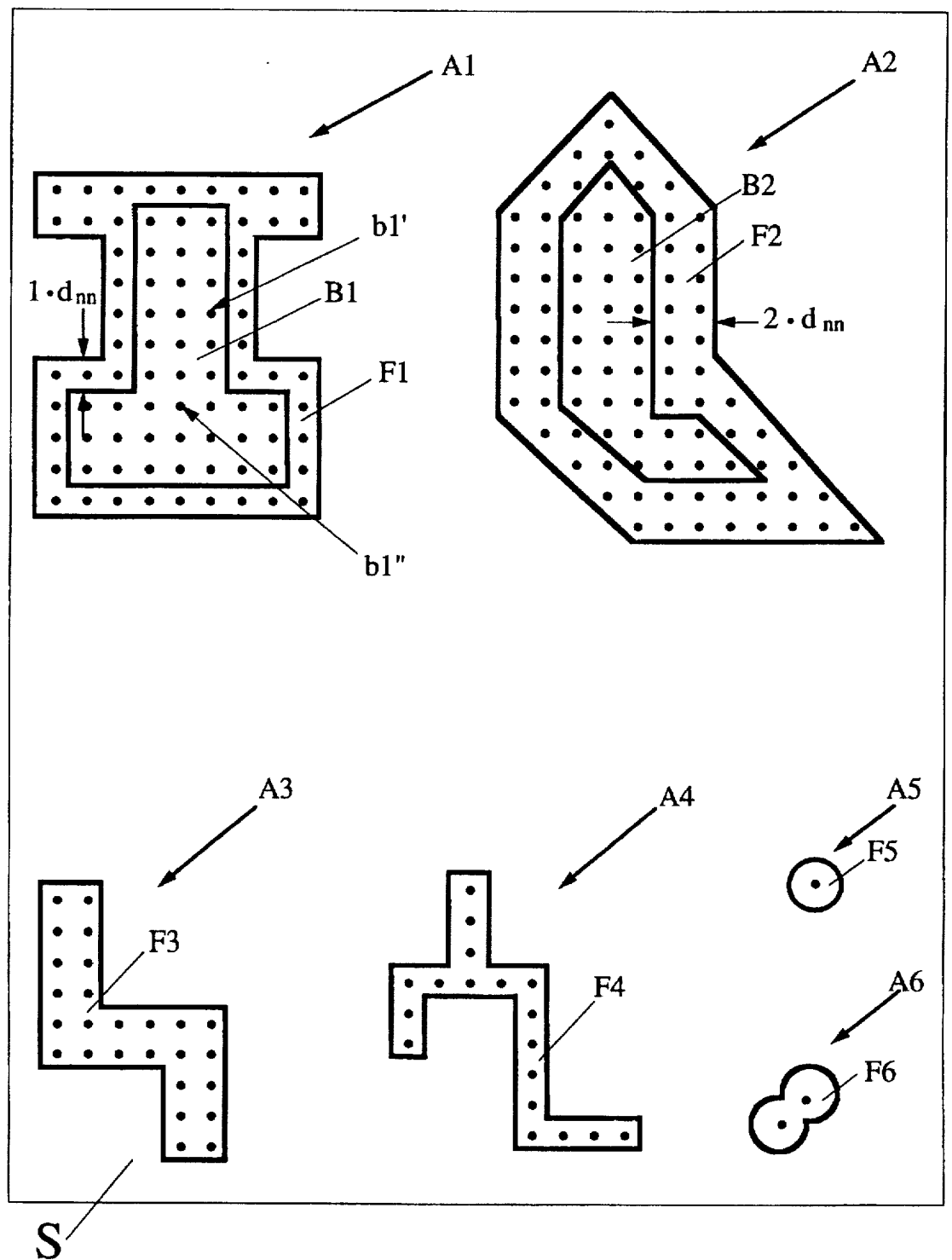
FIG. 1 is a schematic illustration of a portion of a typical image that may be presented for lithographic rastering.

FIG. 1 illustrates a portion of a typical image that might be presented for lithographic printing onto a substrate S. The image pixels are divided into a collection of one or more geometrically isolated pixel arrays, A1, A2, A3, A4, A5 and A6, with all pixels in a pixel array being connected to each other within that array. This typical image includes the polygonal regions B1 and B2 that are referred to as "bulk" regions and includes boundaries, edges, traces and isolated pixels F1, F2, F3, F4, F5 and F6 that are referred to as "fine" regions. The fine regions F1 and F2 form part or all of the pixels on or near the boundaries of the respective bulk regions B1 and B2, as shown in FIG. 1. The fine regions F3 and F4 are traces of widths one pixel and two pixels, respectively, and the fine regions F5 and F6 represent isolated regions of one or more pixels that might serve as electrical contacts or electrical vias. In FIG. 1, the distance between adjacent pixels is exaggerated to more clearly illustrate bulk and fine regions. Each fine region consists of all image pixels in an isolated array of connected pixels that are within P pixels of a boundary point in that array, where P is a selected positive integer, such as 1, 2 or 3.

In a conventional approach, "pixel democracy" prevails: each image pixel is given the same irradiation treatment and requires equal time for imaging by a standard pixel imager. Thus, if a substrate has a rectangular array of M1×M2 total pixels thereon and the typical image requires M3 pixel images (M3≦M1·M2), the total time required for pixel imaging would be at least M1$\Delta t_p$+M1·M2−M3$\Delta t_{np}$+(M1·M2−1)$\Delta t_{trans}$, where $\Delta t_p$ is the time required to determine that a single pixel is to be imaged and to image that image pixel, $\Delta t_{np}$ is the time required to determine that a particular pixel is not to be imaged and to skip that pixel, and $\Delta t_{trans}$ is the time required to redirect the beam for the next pixel to be interrogated. Little or no reduction in total imaging time accrues in covering an image that has relatively large regions where no pixels are to be imaged, or where only a few isolated pixels are to be imaged.

Let $d_{nn}$ be the nearest neighbor pixel-to-pixel distance within the array. In one embodiment of the invention, the typical image shown in FIG. 1 is decomposed into a first assembly of fine regions F1, F2, F3, F4, F5 and F6, where F3, F4, F5 and F6 are shown in FIG. 1 and F1 and F2 are shown in FIGS. 2A and 2B, and a second assembly of bulk regions B1 and B2, shown in FIGS. 2C and 2D. Each bulk region, such as B1, has a "breadth" of at least N pixels, where N is a selected integer (N≧2). That is, any pixel within a bulk region has a straight line segment of length at least equal to (N−1)$d_{nn}$ in a selected direction on the substrate. In FIG. 2C, N is chosen as N=2, for illustrative purposes. However, N can be chosen as N=3, N=4 or any larger positive integer as well. Each bulk region and each fine region should be "connected" in the sense that any pixel in that region can be connected to any other pixel in that region by a sequence of straight line segments that connect nearest neighbor pixels and that pass through only pixels that also belong to that region.

In a first embodiment of the invention, a first rastering lithographic imager is used to set down the pixels in the bulk regions B1 and B2 (FIGS. 2C and 2D). Each component of the image at a single pixel may be a circle or oval whose minimum diameter is greater than 0.707 times the minimum pixel-to-pixel distance $d_{nn}$ for the desired imager, as indicated by the pixel image boundary line $B_p$ shown in FIG. 2C. A "filled in" collection of such pixel images will produce a continuous pattern such as the bulk region B1 or B2 in FIGS. 2C and 2D. A bulk region, such as B1 or B2, may be covered in a single swath of pixel images or may be covered by an array of two or more rectangular or polygonal sub-components of that bulk region. For example, the bulk region B1 in FIG. 2C can be decomposed into rectangular sub-components B1-1 and B1-2; and the bulk region B2 would be decomposed into a rectangular sub-component B2-1, a triangular sub-component B2-2 and a parallelogram sub-component B2-3.

Coverage of each pixel image at the edges or other boundaries of a bulk region is of lessened importance, because the fine regions are used to more precisely define these edges and other boundaries. Because an edge, boundary or point is covered by a free region pixel imager, the bulk region pixel imager can move more quickly within a bulk region can set down a plurality of pixel images in a single imaging time interval, and can be somewhat less precise for its own pixel imaging, compared to the precise imaging required for pixel-by-pixel imaging within a fine region. This allows a pixel image for a bulk region with, say, M3 pixels that are to be imaged to be set down in a time interval of length of the order of m·$\Delta t_p$, where m is an integer of the order of 2–5, rather than in a time interval with the much larger length of M3·$\Delta t_p$, where M3 may be greater than 100.

After (or before) all the bulk regions, such as B1 and B2 shown in FIGS. 2C and 2D, are set down in a desired pixel pattern, another lithographic imager of pixels (or a reconfigured first pixel imager) is used to set down the collection of free regions, such as F1, F2, F3, F4, F5 and F6 shown in FIGS. 1, 2A and 2B, that make up the remainder of the desired pixel pattern. Here, more attention to detail and preciseness in pixel location is required. This collection of pixels from fine regions can be set down one pixel at a time, if desired. Alternatively, the collection of fine regions can be set down first, followed by imaging of the collection of bulk regions. In FIGS. 2A and 2B, P=1 and P=2, respectively, are chosen for illustrative purposes.

Optionally, a fine region, such as F2, is further decomposed into a first sub-assembly of linear segments of P1 pixels (P1 consecutive pixels arrayed in a line, where P1 is a selected integer satisfying 2≦P1≦P) and a second sub-assembly having the remainder of the pixels that belong to the fine region. This second sub-assembly could contain single pixels from the original fine region (e.g., at a "corner" of the original fine region) plus line segments that each have no more than P1−1 consecutive pixels in the line segment. If this preferred approach is adopted, a second pixel imager sets down linear segments of P1 consecutive pixels, and a third pixel imager sets down isolated pixels and linear segments of up to P1−1 consecutive pixels. The second imager, then, sets down P1 pixels in a linear segment in a time interval of approximately $\Delta t_p$, and the third pixel imager isolated pixels and linear segments of length up to P1-1 consecutive pixels, with each such isolated pixel or linear segment requiting a time interval of length approximately $\Delta t_p$. Only in this second sub-assembly of pixels from the fine region is progress approximately as slow as progress in a conventional pixel-by-pixel imaging approach.

Figure 3:
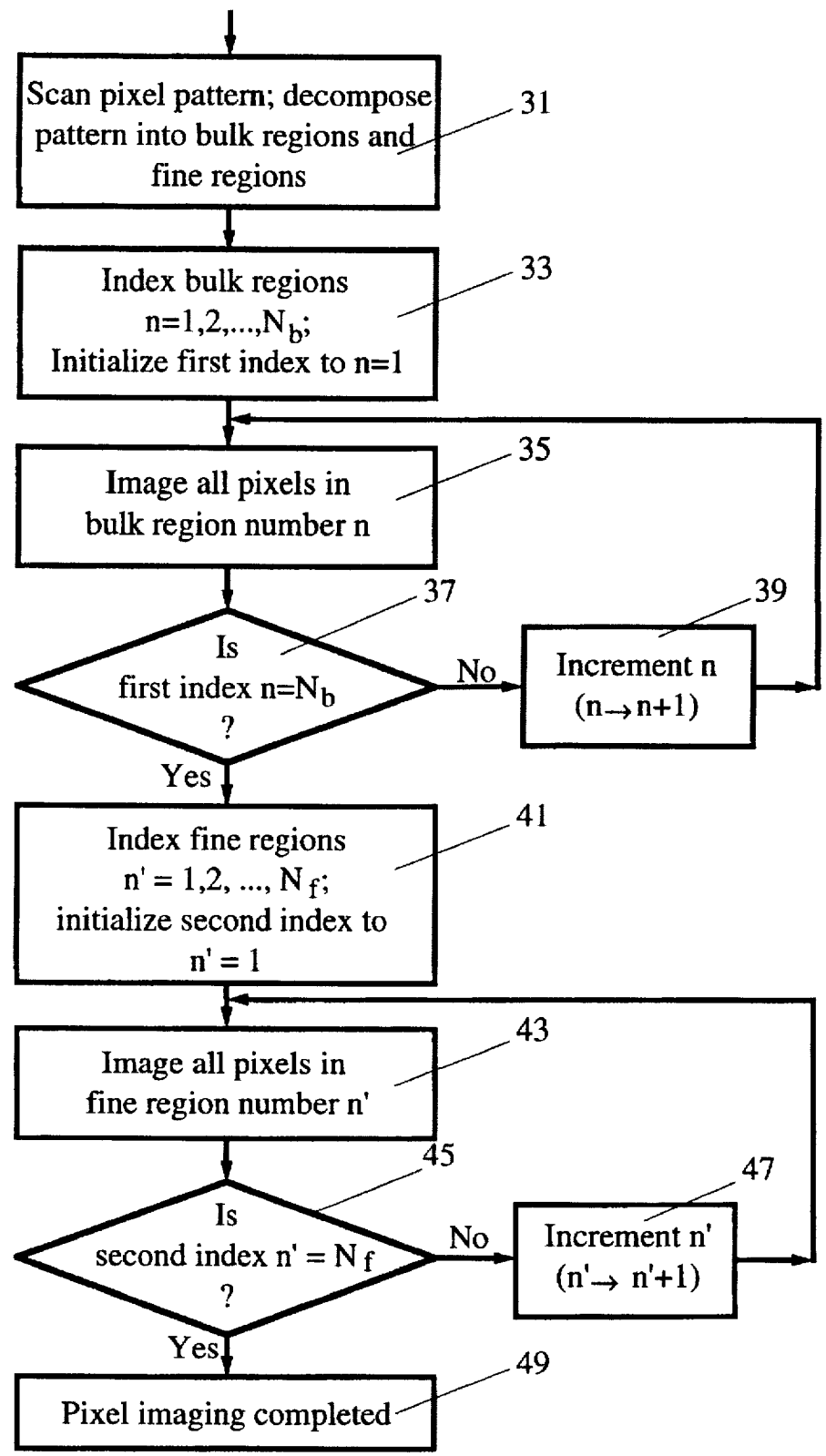
FIGS. 3 and 4 are flow charts illustrating first and second embodiments of the invention.

FIG. 3 is a flow chart illustrating the steps in a preferred embodiment of the invention. In step 31, the desired pixel pattern is scanned and analyzed, and the pixel pattern is decomposed into a first collection of bulk regions and a second collection of free regions, where, preferably, any pixel in the desired pattern is in a bulk region or in a free region, but not both. In step 33 the system determines the number $N_b$ of bulk regions in the desired pattern, indexes these bulk regions with a first index $n=1, 2, \ldots, N_b$, and initializes this first index to $n=1$. In step 35, all pixels in the bulk region number n are imaged either simultaneously or in a small number of time intervals, each of length $\Delta t_p$. In step 37, the system determines if this bulk region (number n) is the last bulk region in the collection (i.e., if $n=N_b$). If the answer is "no," the system increments n ($n \rightarrow n+1$) in step 39 and recycles to step 35.

If the answer in step 37 is "yes," the system moves to step 41, determines the number $N_f$ of fine regions in the pattern, numbers these fine regions with a second index n' ($n'=1, 2, \ldots, N_f$), and initializes this second index to $n'=1$. In step 43, the system images all the pixels (or pixel collections) in fine region number n'. In step 45, the system determines if this fine region (number n') is the last free region in the collection (i.e., if $n'=N_f$). If the answer is "no," the system increments n' ($n' \rightarrow n'+1$) in step 47 and recycles to step 43. If the answer in step 45 is "yes," the system has completed the task of pixel imaging for this desired pattern, and the system moves to step 49 (completion).

Figure 4:
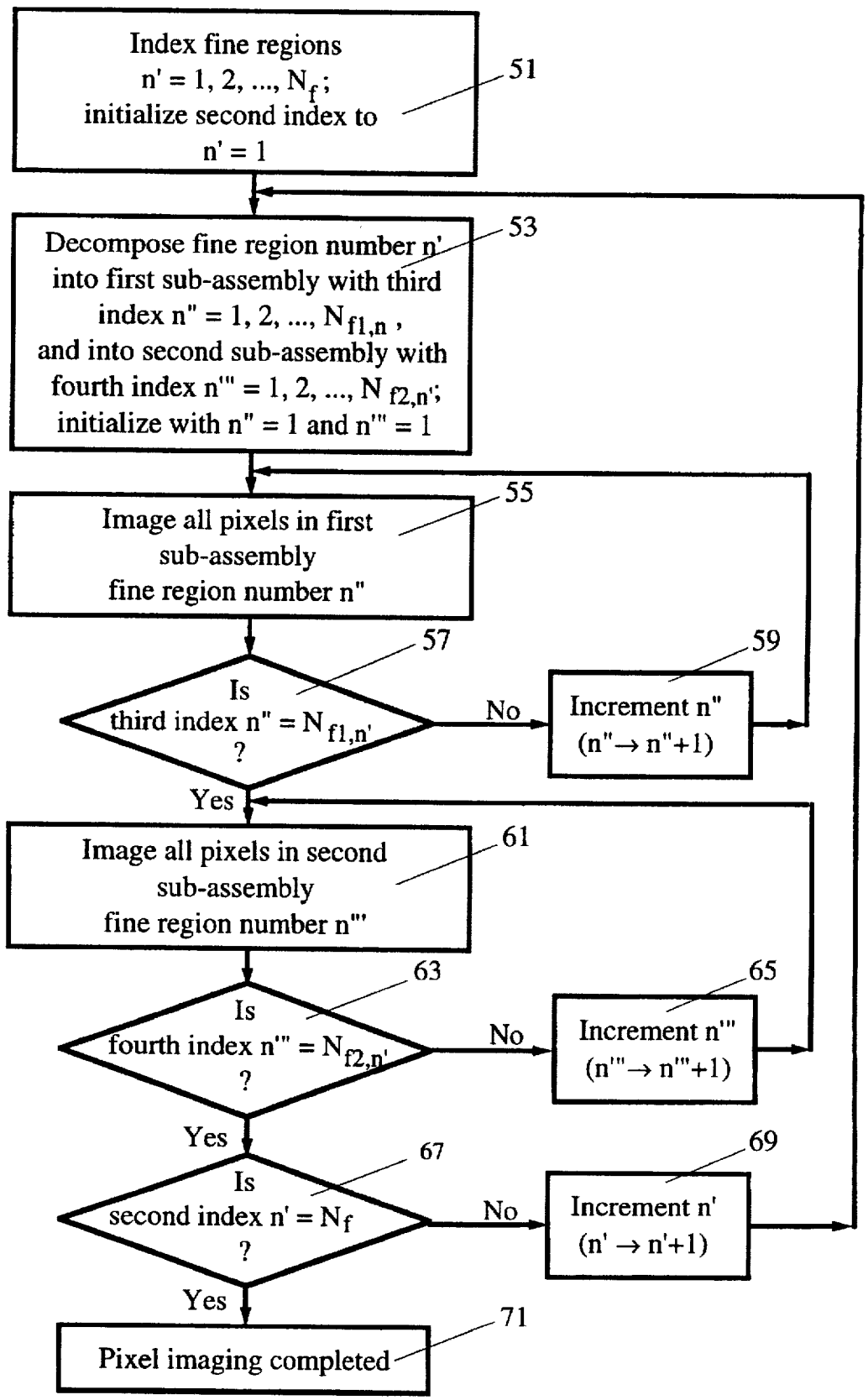

The flow chart in FIG. 4 is identical to the flow chart in FIG. 3 for steps 31, 33, 35, 37 and 39. From step 37, the system moves to step 51 (if $n=N_b$), where the number $N_f$ of fine regions (numbered n'1, 2, ..., $N_f$) is determined and the index n' is initialized ($n'=1$). In step 53, each fine region (n') is decomposed into a first sub-assembly of linear segments of P consecutive pixels of pixel length $\geq P$, numbered with a third index $n''=1, 2, \ldots, N_{f1,n'}$, that is initialized ($n''=1$) and into a second sub-assembly of isolated pixels and linear segments of pixel length $\leq P-1$, numbered with a fourth index $n'''=1, 2, \ldots, N_{f2,n'}$, that is also initialized ($n'''=1$). In step 55, linear segment number n" of pixels in the first sub-assembly is imaged. In step 57, the system determines if $n''=N_{f1,n'}$. If the answer in step 57 is "no," the system increments n" ($n'' \rightarrow n''+1$) in step 59 and recycles to step 55. If the answer in step 57 is "yes," the system moves to step 61 and images an isolated point or linear segment number n'" in the second sub-assembly. In step 63 the system determines if $n'''=N_{f2,n'}$. If the answer in step 63 is "no," the system increments n'" ($n''' \rightarrow n'''+1$) in step 65 and recycles to step 61. If the answer in step 63 is "yes," the system moves to step 67, where it determines whether $n'=N_f$. If the answer in step 67 is "no," the system increments n' ($n' \rightarrow n''+1$) in step 69 and recycles to step 53. If the answer in step 67 is "yes," the system moves to step 71 (completion).

FIGS. 5A, 5B, 5C, 5D, 5E and 5F illustrate suitable shapes for bulk region pixel imaging, including regular triangles, isoceles triangles, rectangles, parallelograms, regular pentagons and regular hexagons, respectively. Each of these shapes has one or two size parameters s1 and s2 associated with it that is prescribed by the user in order to vary the size of the radiation pattern used, and, in FIGS. 5B and 5D, to vary the geometrical shape of the radiation pattern. FIG. 5G illustrates a rectangle with a circular aperture located near its center, as a variant of the rectangle shown in FIG. 5C. The Figure in 5G requires specification of a third size parameter s3, representing a diameter of a circular or ovular aperture in the rectangle. Optionally, the shapes shown in FIGS. 5A, 5B, 5D, 5E and 5F can also be provided with a central aperture with an associated size parameter that represents a diameter of a circular or ovular aperture. Other polygonal and curvilinear patterns can also be used to define suitable shapes for bulk region pixel imaging.

I claim:

1. A method for lithographic rastering of an image, defined by an array of pixels, onto an image-accepting substrate, the method comprising the steps of:

decomposing an image, defined by an array of image pixels that are spaced apart from each other, into a collection of one or more isolated arrays of pixels that together form the image, where an array has a nearest neighbor pixel-to-pixel distance $d_{nn}$;

decomposing each isolated pixel array into a first pixel assembly and a second pixel assembly, where the first pixel assembly contains only image pixels that are within a distance $P.d_{nn}$ of a boundary of the isolated pixel array, where P is a selected positive integer, and the second pixel assembly contains all image pixels not in the first pixel assembly;

irradiating the pixels contained in the first pixel assembly with a first irradiation beam that has a selected beam width of $N1.d_{nn}$, where N1 is a selected integer satisfying $1 \leq N1 \leq P$; and irradiating the pixels contained in the second pixel assembly with a second irradiation beam that irradiates at least N2 contiguous pixels, where N2 is a selected integer $\geq 2$.

2. The method of claim 1, further comprising the step of choosing said integer P from the class of selected positive integers consisting of the integers 1, 2 and 3.

3. The method of claim 1, further comprising the step of irradiating said pixels in said second pixel assembly by an irradiation beam that has a beam cross-section shape drawn from the class of cross-section shapes consisting of an equilateral triangle, an isoceles triangle, a parallelogram, a regular pentagon and a regular hexagon.

4. The method of claim 3, further comprising the step of providing said cross-section shape for said irradiation beam with an aperture in the interior of said shape, within which said irradiation beam does not irradiate any pixels.

5. A method for lithographic rastering of an image, defined by an array of pixels, onto an image-accepting substrate, the method comprising the steps of:

decomposing an image, defined by an array of image pixels that are spaced apart from each other, into a collection of one or more isolated pixel arrays that together form the image, where an array has a nearest neighbor pixel-to-pixel distance $d_{nn}$;

decomposing each isolated pixel array into a first pixel assembly, a second pixel assembly and a third pixel assembly, where the first pixel assembly contains only image pixels that are within a distance of $P.d_{nn}$ from a boundary of the isolated pixel array and that have a pixel width of at least P1 pixels, where P and P1 are selected positive integers with $2 \leq P1 \leq P$, where the second pixel assembly contains only image pixels that are within a distance $P.d_{nn}$ from a boundary of the isolated pixel array and that have a pixel width of not more than P1-1 pixels, and the third pixel assembly contains all image pixels not in the first pixel assembly and not in the second pixel assembly;

irradiating the pixels contained in the first pixel assembly with a first irradiation beam that has a selected beam width of at least P1 pixels;

irradiating the pixels contained in the second pixel assembly with a second irradiation beam that has a selected beam width of no more than P1-1 pixels; and irradiating the pixels contained in the third pixel assembly with a third irradiation beam that irradiates at least N3 contiguous pixels, where N3 is a selected integer $\geq 2$.

6. The method of claim 5, further comprising the step of choosing said integer P from the class of selected positive integers consisting of the integers 2, 3 and 4.

7. The method of claim 5, further comprising the step of irradiating said pixels in said second pixel assembly by an irradiation beam that has a beam cross-section shape drawn from the class of cross-section shapes consisting of an equilateral triangle, an isoceles triangle, a parallelogram, a regular pentagon and a regular hexagon.

8. The method of claim 7, further comprising the step of providing said cross-section shape for said irradiation beam with an aperture in the interior of said shape, within which said irradiation beam does not irradiate any pixels.

9. Apparatus for lithographic rastering of an image, defined by an array of pixels, onto an image-accepting substrate, the apparatus comprising:

a source of an electrically charged particle beam; and a computer that is connected to and controls the charged particle beam source, where the computer is programmed to:

decompose an image, defined by an array of image pixels that are spaced apart from each other, into a collection of one or more isolated arrays of pixels that together form the image, where an array has a nearest neighbor pixel-to-pixel distance $d_{nn}$;

decompose each isolated pixel array into a first pixel assembly and a second pixel assembly, where the first pixel assembly contains only image pixels that are within a distance $P.d_{nn}$ of a boundary of the isolated pixel array, where P is a selected positive integer, and the second pixel assembly contains all image pixels not in the first pixel assembly;

cause the charged particle beam source to irradiate the pixels contained in the first pixel assembly with a first irradiation beam that has a selected beam width of $N1.d_{nn}$, where N1 is a selected integer satisfying $1 \leq N1 \leq P$; and cause the charged particle beam source to irradiate the pixels contained in the second pixel assembly with a second irradiation beam that irradiates at least N2 contiguous pixels, where N2 is a selected integer $\geq 2$.

10. The apparatus of claim 9, wherein said integer P is chosen from the class of selected positive integers consisting of the integers 1, 2 and 3.

11. The apparatus of claim 9, wherein said computer causes said charged particle beam source to irradiate said pixels in said second pixel assembly by an irradiation beam that has a beam cross-section shape drawn from the class of cross-section shapes consisting of an equilateral triangle, an isoceles triangle, a parallelogram, a regular pentagon and a regular hexagon.

12. The apparatus of claim 11, wherein said computer causes said charged particle beam source to provide said irradiation beam with an irradiation beam shape having an aperture in the interior of said beam shape, within which said irradiation beam does not irradiate any pixels.

13. Apparatus for lithographic rastering of an image, defined by an array of pixels, onto an image-accepting substrate, the apparatus comprising:

a source of an electrically charged particle beam; and a computer that is connected to and controls the charged particle beam source, where the computer is programmed to:

decompose an image, defined by an array of image pixels that are spaced apart from each other, into a collection of one or more isolated pixel arrays that together form the image, where an array has a nearest neighbor pixel-to-pixel distance $d_{nn}$;

decompose each isolated pixel array into a first pixel assembly, a second pixel assembly and a third pixel assembly, where the first pixel assembly contains only image pixels that are within a distance of $P.d_{nn}$ from a boundary of the isolated pixel array and that have a pixel width of at least P1 pixels, where P and P1 are selected positive integers with $2 \leq P1 \leq P$, where the second pixel assembly contains only image pixels that are within a distance $P.d_{nn}$ from a boundary of the isolated pixel array and that have a pixel width of not more than P1-1 pixels, and the third pixel assembly contains all image pixels not in the first pixel assembly and not in the second pixel assembly;

cause the charged particle beam source to irradiate the pixels contained in the first pixel assembly with a first irradiation beam that has a selected beam width of at least P1 pixels;

cause the charged particle beam source to irradiate the pixels contained in the second pixel assembly with a second irradiation beam that has a selected beam width of no more than P1-1 pixels; and cause the charged particle beams source to irradiate the pixels contained in the third pixel assembly with a third irradiation beam that irradiates at least N3 contiguous pixels, where N3 is a selected integer $\geq 2$.

14. The apparatus of claim 13, wherein said integer P is chosen from the class of selected positive integers consisting of the integers 2, 3 and 4.

15. The apparatus of claim 13, wherein said computer causes said charged particle beam source to irradiate said pixels in said second pixel assembly by an irradiation beam that has a beam cross-section shape drawn from the class of cross-section shapes consisting of an equilateral triangle, an isoceles triangle, a parallelogram, a regular pentagon and a regular hexagon.

16. The apparatus of claim 15, wherein said computer causes said charged particle beam source to provide said irradiation beam with an irradiation beam shape having an aperture in the interior of said beam shape, within which said irradiation beam does not irradiate any pixels.

* * * * *